(12) United States Patent
Hosek et al.

(10) Patent No.: US 11,562,921 B2
(45) Date of Patent: Jan. 24, 2023

(54) ROBOT HAVING PREDETERMINED ORIENTATION

(71) Applicant: Persimmon Technologies, Corp., Wakefield, MA (US)

(72) Inventors: Martin Hosek, Lowell, MA (US); Leonard T. Lilliston, III, Roxbury, MA (US); Sripati Sah, Wakefield, MA (US)

(73) Assignee: Persimmon Technologies Corporation, Wakefield, MA (US)

( * ) Notice: Subject to any disclaimer, the term of this patent is extended or adjusted under 35 U.S.C. 154(b) by 0 days.

(21) Appl. No.: 16/246,944

(22) Filed: Jan. 14, 2019

(65) Prior Publication Data

US 2019/0148199 A1 May 16, 2019

Related U.S. Application Data

(60) Division of application No. 15/266,562, filed on Sep. 15, 2016, now Pat. No. 10,181,416, which is a continuation of application No. 14/617,227, filed on Feb. 9, 2015, now Pat. No. 9,478,451.

(60) Provisional application No. 61/970,533, filed on Mar. 26, 2014, provisional application No. 61/937,848, filed on Feb. 10, 2014.

(51) Int. Cl.
*H01L 21/677* (2006.01)
*B25J 19/02* (2006.01)
*B25J 13/08* (2006.01)
*B25J 9/04* (2006.01)
*H02K 99/00* (2014.01)
*H02K 55/00* (2006.01)

(52) U.S. Cl.
CPC ........ *H01L 21/67742* (2013.01); *B25J 9/042* (2013.01); *B25J 13/088* (2013.01); *B25J 19/02* (2013.01); *H02K 55/00* (2013.01); *H02K 99/20* (2016.11)

(58) Field of Classification Search
CPC . B25J 9/042; B25J 9/099; B25J 13/088; B25J 19/02; H01L 21/67742; H02K 11/0015
See application file for complete search history.

(56) References Cited

U.S. PATENT DOCUMENTS

| 2,993,518 | A | | 7/1961 | Bork |
| 3,482,321 | A | * | 12/1969 | Inshaw .................... G01B 3/18 |
| | | | | 33/819 |
| 4,888,509 | A | | 12/1989 | Tomasek |
| 4,951,521 | A | | 8/1990 | Jacobson |
| 5,018,266 | A | | 5/1991 | Hutchinson et al. |
| 5,245,235 | A | | 9/1993 | Nagai |
| 7,736,118 | B2 | | 6/2010 | Uratani |

(Continued)

*Primary Examiner* — Gerald McClain
(74) *Attorney, Agent, or Firm* — Harrington & Smith

(57) ABSTRACT

A method including: locating a shaft of a rotor relative to a stator of a motor, locating a robot arm mount on the shaft, temporarily stationarily fixing the robot arm mount relative to the stator at a predetermined rotational location relative to the stator, and while the robot arm mount is temporarily stationarily fixed relative to the stator at the predetermined rotational location, stationarily fixing the robot arm mount to the shaft by a connection, where the connection allows the robot arm mount to be stationarily fixed to the shaft at one of a plurality of angular orientations.

25 Claims, 12 Drawing Sheets

(56) References Cited

U.S. PATENT DOCUMENTS

| | | | |
|---|---|---|---|
| 7,834,618 B2* | 11/2010 | Moura | G01D 5/2451 |
| | | | 324/207.25 |
| 7,877,894 B2* | 2/2011 | Hayashida | G01B 3/18 |
| | | | 33/831 |
| 8,821,338 B2 | 9/2014 | Thorson | |
| 9,119,655 B2* | 9/2015 | Bowling | A61B 34/10 |
| 2003/0173919 A1* | 9/2003 | Altendorf | H02P 3/24 |
| | | | 318/375 |
| 2008/0014844 A1 | 1/2008 | Pontieri | |
| 2011/0169382 A1* | 7/2011 | Coleman | G01D 5/2006 |
| | | | 310/68 B |
| 2012/0232690 A1 | 9/2012 | Gilchrist | |
| 2013/0014605 A1* | 1/2013 | Caveney | B25J 11/0095 |
| | | | 74/490.03 |
| 2013/0069450 A1 | 3/2013 | Hosek | |
| 2013/0106252 A1 | 5/2013 | Yanagida | |
| 2014/0222207 A1* | 8/2014 | Bowling | B25J 9/1633 |
| | | | 700/261 |
| 2015/0053040 A1 | 2/2015 | Ueda | |
| 2015/0229187 A1 | 8/2015 | Friedman | |
| 2016/0099634 A1 | 4/2016 | Nakano | |
| 2016/0101526 A1 | 4/2016 | Saito | |
| 2017/0361459 A1* | 12/2017 | Caveney | B25J 11/0095 |

* cited by examiner

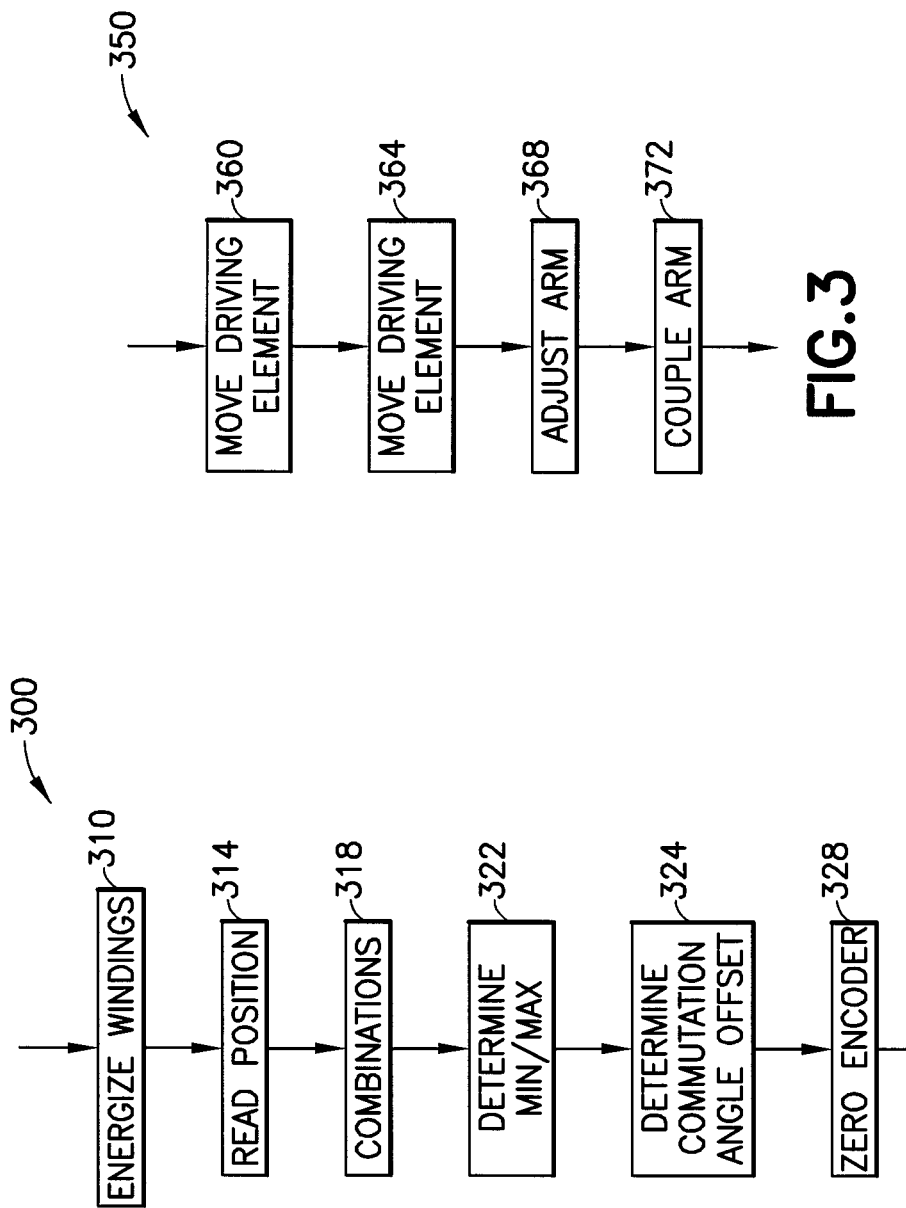

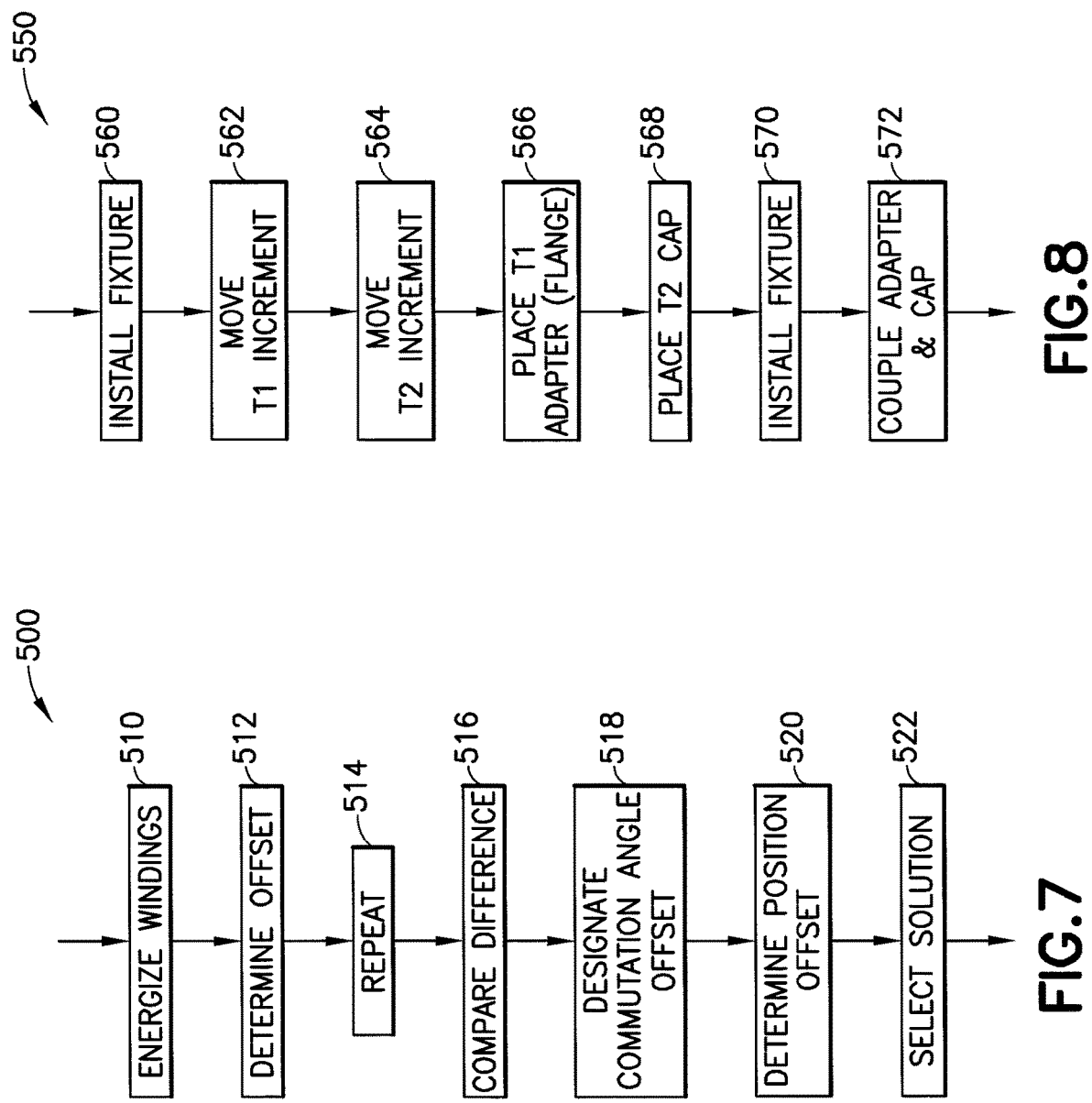

ROBOT HAVING PREDETERMINED ORIENTATION

CROSS REFERENCE TO RELATED APPLICATION

This application is a divisional application of copending U.S. application Ser. No. 15/266,562 filed Sep. 15, 2016, which is a continuation patent application of U.S. application Ser. No. 14/617,227 filed Feb. 9, 2015, which claims priority to U.S. Provisional Patent Application Ser. No. 61/970,533 filed on Mar. 26, 2014 and to U.S. Provisional Patent Application Ser. No. 61/937,848 filed on Feb. 10, 2014 which are hereby incorporated by reference herein in their entireties.

BACKGROUND

Technical Field

The exemplary and non-limiting embodiments relate generally to a robot drive and, more particularly, to stators, rotors and encoders.

Brief Description of Prior Developments

Substrate transport apparatus are known which have a robot arm and a drive for moving the arm. Encoders are provide to determine the location of a rotor of the drive relative to a stator of the drive for position awareness of the drive and, thus, position awareness of the robot arm.

SUMMARY

The following summary is merely intended to be exemplary. The summary is not intended to limit the scope of the claims.

In accordance with one aspect, an example embodiment is provided in an apparatus comprising a stator configured to be stationarily connected to a housing; and a rotor configured to have a robot arm connected thereto, where the rotor comprises a shaft and an robot arm mount adjustably connected to the shaft; where the stator and the rotor comprise mechanical reference locators to temporarily stationarily locate the robot arm mount to the stator for subsequently stationarily fixing the robot arm mount to the shaft.

In accordance with another aspect, an example embodiment method comprises locating a shaft of a rotor relative to a stator of a motor; locating a robot arm mount on the shaft; temporarily stationarily fixing the robot arm mount relative to the stator at a predetermined rotational location relative to the stator; and while the robot arm mount is temporarily stationarily fixed relative to the stator at the predetermined rotational location, stationarily fixing the robot arm mount to the shaft by a connection, where the connection allows the robot arm mount to be stationarily fixed to the shaft at a plurality of angular orientations.

In accordance with another aspect, an example embodiment is provided in an apparatus comprising a housing; and a substrate transport apparatus connected to the housing, where the substrate transport apparatus comprises a robot arm and a robot drive configured to move the robot arm, where the robot drive comprises: a motor comprising a stator and a rotor; and means for providing predetermined encoder position and motor commutation position with respect to the robot arm relative to the housing for preconfigured controllers to be alternatively used to control the motor, for moving the robot arm, without reconfiguring the controller for use with the robot drive.

In accordance with another aspect, an example embodiment is provided in an apparatus comprising: a stator configured to be stationarily connected to a substrate transport housing; and a rotor configured to have a robot arm connected thereto, where the rotor comprises a shaft and a robot arm mount adjustably connected to the shaft, where the stator and rotor are configured to adjustably locate the robot arm mount to the shaft to provide a predetermined location of the robot arm mount relative to the stator to compensate for the stator being located at one of a plurality of different locations on the substrate transport housing.

BRIEF DESCRIPTION OF THE DRAWINGS

The foregoing aspects and other features are explained in the following description, taken in connection with the accompanying drawings, wherein:

FIG. 2 is a diagram illustrating an example method;
FIG. 3 is a diagram illustrating an example method;
FIG. 7 is a diagram illustrating an example method;
FIG. 8 is a diagram illustrating an example method.

DETAILED DESCRIPTION OF EMBODIMENTS

Figure 1:
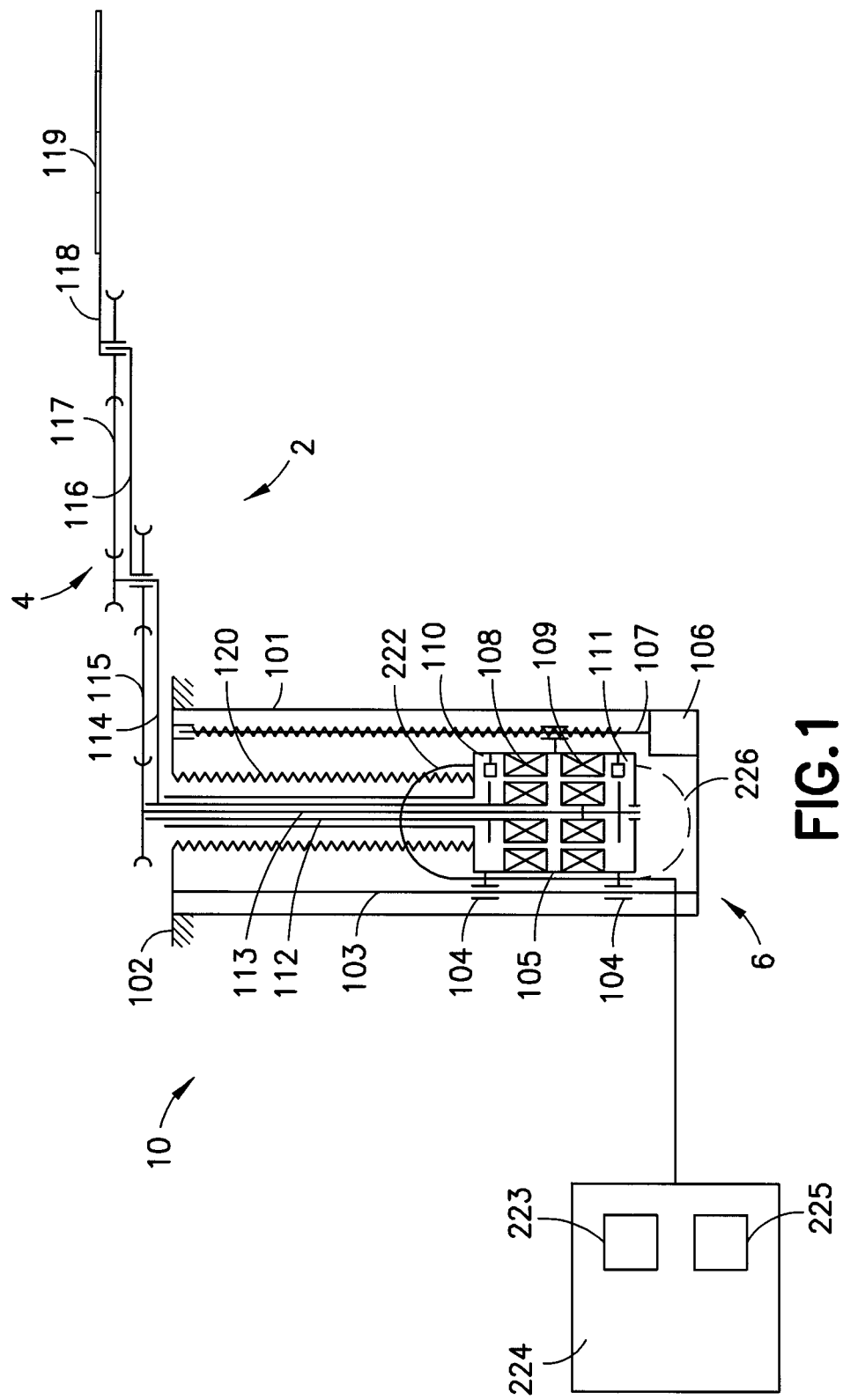
FIG. 1 is a schematic view of an example embodiment.

Conventional robots have multiple axis of motion that may be any suitable type of joint. These joints typically have motors, position encoders, transmissions and linkages. Referring to FIG. 1, there is shown a schematic view of an example robot drive 10 of a substrate transport apparatus 2 comprising features as described herein. The robot is a vacuum capable robot. Although the robot drive is described with respect to a vacuum robot, any suitable robot drive (atmospheric or otherwise) may be provided having features as disclosed. Aside from the preferred embodiment or embodiments disclosed, the disclosed is capable of other embodiments and of being practiced or being carried out in various ways. Thus, it is to be understood that the disclosed is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

An example robotic manipulator or apparatus 2 incorporating the vacuum-compatible direct-drive system of one or more embodiments is shown in FIG. 1. The robotic manipulator may be built around frame 101, e.g., an aluminum extrusion, suspended from flange or mounting arrangement 102. Alternatively, the mounting arrangement may be on the side of frame 101, at the bottom of frame 101 or frame 101 may be mounted in any other suitable manner. Frame 101 may incorporate one or more vertical rail 103 with linear bearings 104 to provide guidance to housing 105 driven by motor 106 via ball-screw mechanism 107. Only one rail 103 is shown for simplicity. Alternatively, motor housing 105 may be driven by a linear motor, attached directly to frame 101 or coupled to frame 101 in any other suitable movable or unmovable manner. Motor housing 105 may incorporate one, two, three, four or more direct-drive modules as will be described in greater detail below. Housing 105 may house motors 108, 109 equipped with position encoders 110 and 111. Housing 105 is shown as an exemplary structure where housing 105 may have portions configured with respect to motors 108, 109 and position encoders 110 and 111 as will be described in greater detail below. Bellows 120 may be used to accommodate motion of motors 105 along vertical rail(s) 103, separating the environment where movable components of motors 108, 109 and encoders 110, 111 operate, for instance vacuum, from the outside environment, for example, atmosphere.

In the example of FIG. 1, two direct-drive modules, each having one motor and one encoder, are shown. However, any suitable number of direct-drive modules with any suitable number of motors and encoders may be used. Inverted service loop 222 may be utilized to supply power to the direct-drive module(s) and facilitate signaling between the direct-drive module(s) and other components of the robotic system, such as a controller 224, as shown in FIG. 1. The controller 224 comprises at least one processor 223 and at least one memory 225 having software for controlling the drive 10; including control based upon signals from the position encoders. Alternatively, a regular, non-inverted service loop 226 may be employed. As shown in FIG. 1, upper motor 108 may drive hollow outer shaft 112 connected to first link 114 of the robot arm. Lower motor 109 may be connected to coaxial inner shaft 113 which may be coupled via belt drive 115 to second link 116. Another belt arrangement 117 may be employed to maintain radial orientation of third link 118 regardless of the position of the first two links 114 and 116. This may be achieved due to a 1:2 ratio between the pulley incorporated into the first link and the pulley connected to the third link. In alternate embodiments, any suitable ratio or linkage may be provided. Third link 118 may form an end-effector that may carry payload 119, for instance, a semiconductor substrate. It should be noted that the robotic arm of FIG. 1 is shown for exemplary purposes only. Any other suitable arm mechanism or drive mechanism may be used either alone or in combination. For example, multiple direct-drive modules according to one or more embodiments may be utilized in a single robotic manipulator or a robotic manipulator having multiple manipulators or any suitable combination. Here, the modules may be stacked in different planes along substantially the same axis of rotation, located concentrically in substantially the same plane, arranged in a configuration that combines the stacked and concentric arrangements, or incorporated into the robotic manipulator in any other suitable manner.

The vacuum-compatible direct-drive system of one or more embodiments may comprise a housing and a radial field motor arrangement including a stator and a rotor arranged in the vicinity of the stator so that it may rotate with respect to the stator and interact with the stator through a magnetic field substantially radial with respect to the axis of rotation of the rotor. Alternatively, an axial field motor or a combination radial/axial field motor may be provided, or combinations thereof. The stator may include a set of windings energized by a suitable controller based on the relative position of the rotor with respect to the stator. The rotor may include a set of permanent magnets with alternating polarity.

In the embodiment shown, the housing may separate an atmospheric type environment on the outside of the housing from a vacuum or other non-atmospheric environment inside of the housing. Active components, such as the encoder read head or the stator may be fastened to and/or interface with the housing as will be described, for example, the read head or stator may be pressed into or otherwise fastened to the housing to eliminate conventional clamping components and may be encapsulated in a suitable material, such as vacuum compatible epoxy based potting, to limit out-gassing of the components to the vacuum or other non-atmospheric environment as will be described. Here, the encapsulated component may be in vacuum, atmosphere or any suitable environment where the encapsulation protects the stator from the environment, e.g., prevents corrosion, and facilitates efficient heat removal. The encapsulation may also bond the read head or stator to the housing or other component or sub component, further securing the device with respect to the housing. The wires leading to the windings or other active components of the read head or windings of the stator may pass through an opening of the housing which is sealed by the encapsulation, thus eliminating the need for a separate vacuum feed-through. Alternatively, the read head or stator may be clamped, bolted or attached in any other suitable manner to the housing, and the wires leading from the atmospheric environment to the windings or other active components of the read head or the windings of the stator may be routed through a vacuum feed-through or passed through the wall of the housing in any other suitable manner.

In accordance with one aspect of the disclosed embodiment, a robot drive is provided having a preconfigured and predetermined orientation of an arm with respect to a drive. The orientation may be with respect to an encoder position and a motor commutation position where more than one preconfigured controller may be utilized to interface to the drive without reconfiguration. Similarly, a first drive may be replaced by a second drive without reconfiguring the controller that was interfacing with the first drive. Similarly, a first arm may be replaced by a second arm on a first drive without reconfiguring the controller that was interfacing with the first drive. Here, multiple drive units may be interchangeable without reconfiguring the controller interfacing with the drives. The drive may be preconfigured by utilizing one or more of a combination of mechanical features, component software configured features (on board the drive), fixtures or otherwise. By way of example, a stator may have a commutation angle reference to a housing that the stator is fixed to. By way of example, the stator may be installed with an arbitrary commutation reference angle and the controller then configured via a variable to be able to properly commutate the stator and rotor combination. In the disclosed embodiment, the variable within the controller may not be required as the drives are interchangeable. This may be accomplished by providing a stator with a predetermined phase location with respect to the housing, for example, with reference features, feature machined, by fixture set location with orientation feature or otherwise. Alternately, an adjustable and clockable rotor may be provided with an arbitrary stator location where the rotor angular orientation may be adjusted relative to the shaft to which it is mounted or otherwise. Similarly, the rotor may be provided with features machined in, clockable or otherwise. Similarly, an encoder may be provided clockable, with an electronic zero or fixture set with feature like slot. As will be described in greater detail below, an electronically set zero may be utilized in an encoder to obviate the need to fixture set the encoder and stator. Similarly, the output shaft and arm may be adjustable and clockable and used in combination with setting the encoder to the appropriate zero to commutate. Without the use of an electronically settable encoder zero, mechanical features alone may allow the assembly of the drive and arm such that the components may be assembled without fixtures to make the assembly repeatable such that variables are not required to be changes in the controller to configure a robot drive and/or arm. Here, exemplary mechanical features include orientation pin and slot mating features, poke yoke features, keyed features or otherwise. In one aspect, the arm and drive may be assembled partially or completely with poke yoke features such that the encoder position, motor phasing and arm orientation are consistent from drive and arm to drive and arm. In alternate aspects, in addition to or in place of mechanical features, electronic zero features of encoders in combination with fixtures or other features may be provided.

Referring now to FIG. 2 and FIG. 3, there is shown a method that may be implemented for robot zeroing and having two methods. As seen in FIG. 2, a method is described for encoder-motor phasing and in FIG. 3 a method is described for arm-encoder phasing.

The purpose of the procedure shown in FIG. 2 is to phase the encoder and motor so that a predefined commutation angle offset can be used to commutate the motor based on the position reported by the encoder. The method 300 has portion 310 to energize windings of the motor by applying constant current between two terminals of the motor. This will energize two windings in a wye-configured motor and a single winding in a delta-configured motor. The rotor will move to a position defined by the energized winding(s). The method 300 has portion 314 to read encoder position and determine commutation angle offset based on the winding(s) energized, the direction of the current and the encoder position. The method 300 has portion 318 to repeat portions 310, 314 for the remaining combinations of the motor terminals and for currents in opposite directions. By way of example, this may result in the total of 6 distinct encoder position readings and 6 values of commutation angle offset. In alternate aspects, more or less positions may be used, such as a single position for example. The method 300 has portion 322 to determine the minimum and maximum of the 6 values of the commutation angle offset. The difference between the maximum and minimum value may be calculated. The difference with a predefined accuracy threshold may be compared. Here, if the difference exceeds the accuracy threshold, the method may stop and produce an error. The method 300 has portion 324 to use the 6 values of the commutation angle offset to calculate their average and designate the value as the commutation angle offset. The method 300 has portion 328 to utilize the commutation angle offset to electronically re-zero the encoder or assign an encoder location that is non zero so that the commutation angle offset changes to the predefined commutation angle offset. In one aspect, the procedure can be fully automated, semi automated or performed manually. In alternate aspects, in portion 310, different current patterns through all three terminals of the motors may be used to move the rotor to a position defined by the current pattern. Here, there is potentially an infinite number of positions, limited just by the resolution of the current control or otherwise. In alternate aspects, in portion 314, 318, any number of encoder readings associated with different current patterns may be obtained, and any number of values of commutation angle offset may be calculated. In alternate aspects, in portion 322 any suitable method to check the validity of the read and calculated data may be used. In alternate aspects, in portion 324, any suitable technique to determine the commutation angle offset may be used. In alternate aspects, in portion 328, the rotating part of the encoder, typically the disk, may be mechanically rotated with respect to the rotor of the motor, or the stationary part of the encoder, typically the read-head, may be mechanically repositioned with respect to the stator of the motor to change the commutation angle offset to the predefined commutation angle offset. In alternate aspects, registration features may be used to mechanically align the rotary parts of the encoder and motor, and stationary parts of the encoder and motor to achieve phasing associated with the predefined commutation angle offset.

The purpose of the procedure shown in FIG. 3 is to phase the driven parts of the arm or arm driving component(s) with respect to the encoders so that a predefined configuration of the arm is represented by predefined values of encoder readings. The method 350 has portion 360 to move the first driving element, such as a shaft or rotor or other driving component, to a location defined by a predefined reading from the encoder associated with the first driving shaft. This can be done under servo control, manually, using an external fixture or in any other suitable manner. The method 350 has portion 364 to repeat portion 360 for all remaining driving elements (e.g., shafts) of the arm subject to phasing. The method 350 has portion 368 to adjust the arm to the predefined configuration (which corresponds to the predefined positions of the driving elements of the arm). For instance, move the links driven by the drive shafts to the locations that correspond to the encoder readings associated with the positions of the drive shafts. This can be done manually, using a fixture, utilizing registration pins or by any other suitable method. The method 350 has portion 372 to couple the driven parts of the arm to the driving elements while keeping the driving elements in the predefined positions described in portions 360, 364, and while keeping the predefined arm configuration described in portion 368. The coupling may be mechanically secured upon completion. In the disclosed embodiment, the mechanical design of the coupling may support an adequate phasing capability. For example, slotted bolted interfaces, clamps and other suitable arrangements may be utilized. In alternate aspects, there may be adjustable components between the driving elements and the driven parts of the arm that may be used to achieve the desired phasing, for example, as described in greater detail below with respect to FIGS. 7 and 8. As an example, a flange with an angular adjustment with respect to the driving shaft may be employed. The flange may include a registration feature that then defines the position of the driven part of the arm with respect to the flange. This may facilitate replacement of arms.

In alternate aspects, registration features may be used to mechanically align the driven parts of the arm with the rotary parts of the encoder. In alternate aspects, adjustability of the moving part of the encoder (disk) with respect to the driving element (shaft) may be provided and utilized. Or adjustability of the rotor of the motor with respect to the driving element (shaft) may be provided and utilized. Or adjustability of the stationary part of the encoder (read-head) with respect to the housing of the motor and motor stator may be provided and utilized. In alternate aspects, adjustability of the stator of the motor with respect to the housing of the motor and the stationary part of the encoder may be provided and utilized.

Figure 4:
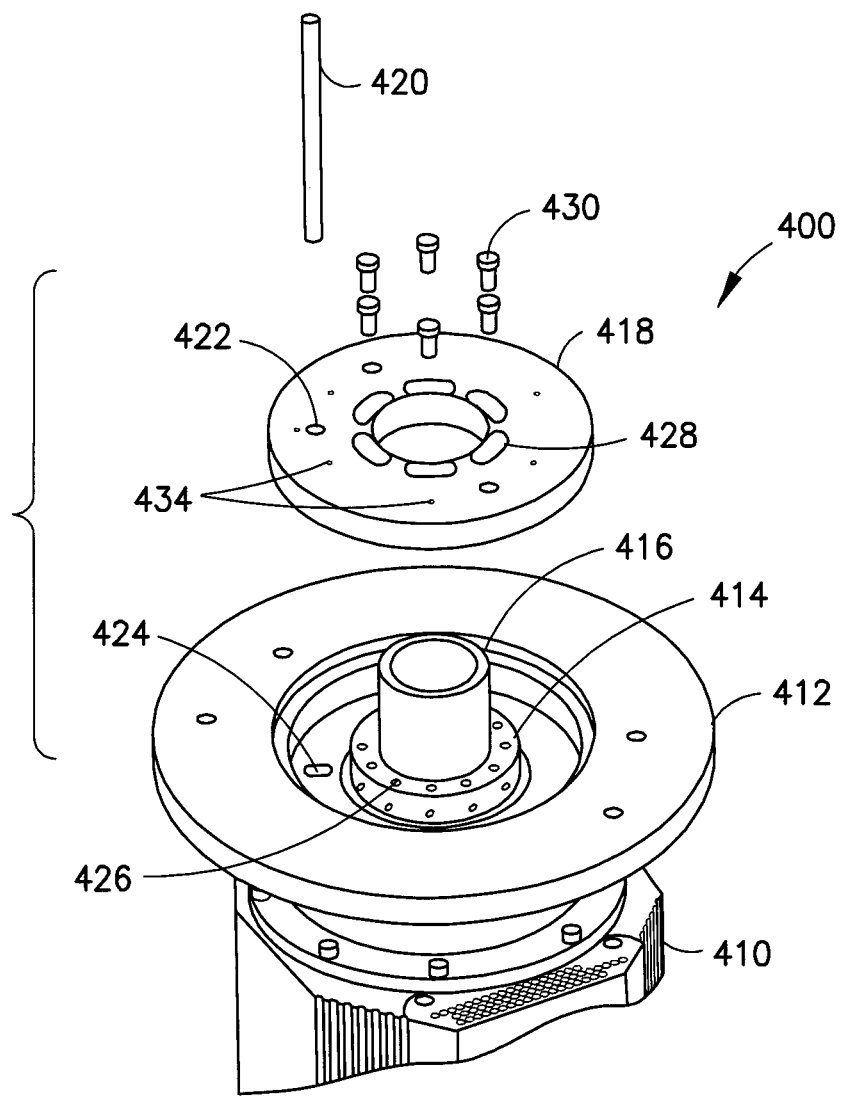
FIG. 4 is a partial exploded perspective view of some components of the drive shown in FIG. 1.
Figure 5:
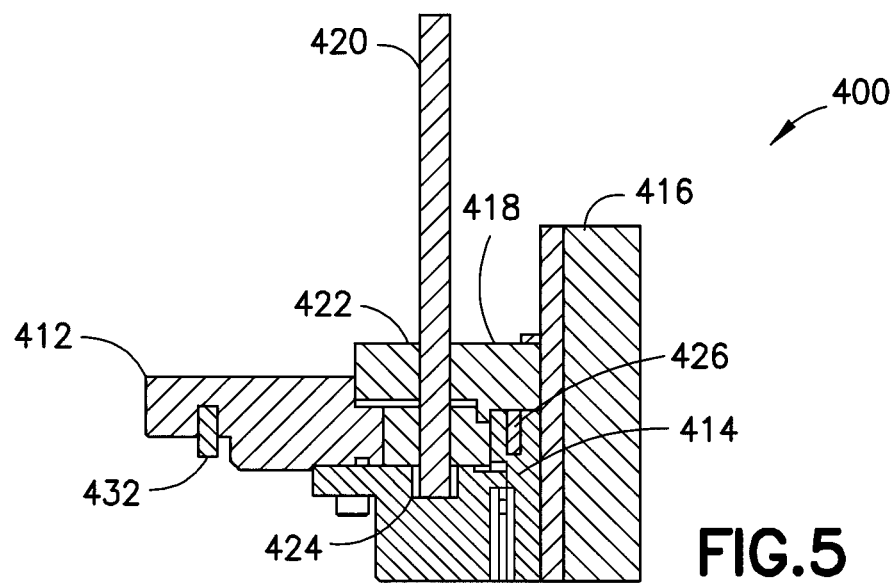
FIG. 5 is a partial cross sectional view of some of the components shown in FIG. 4.
Figure 6:
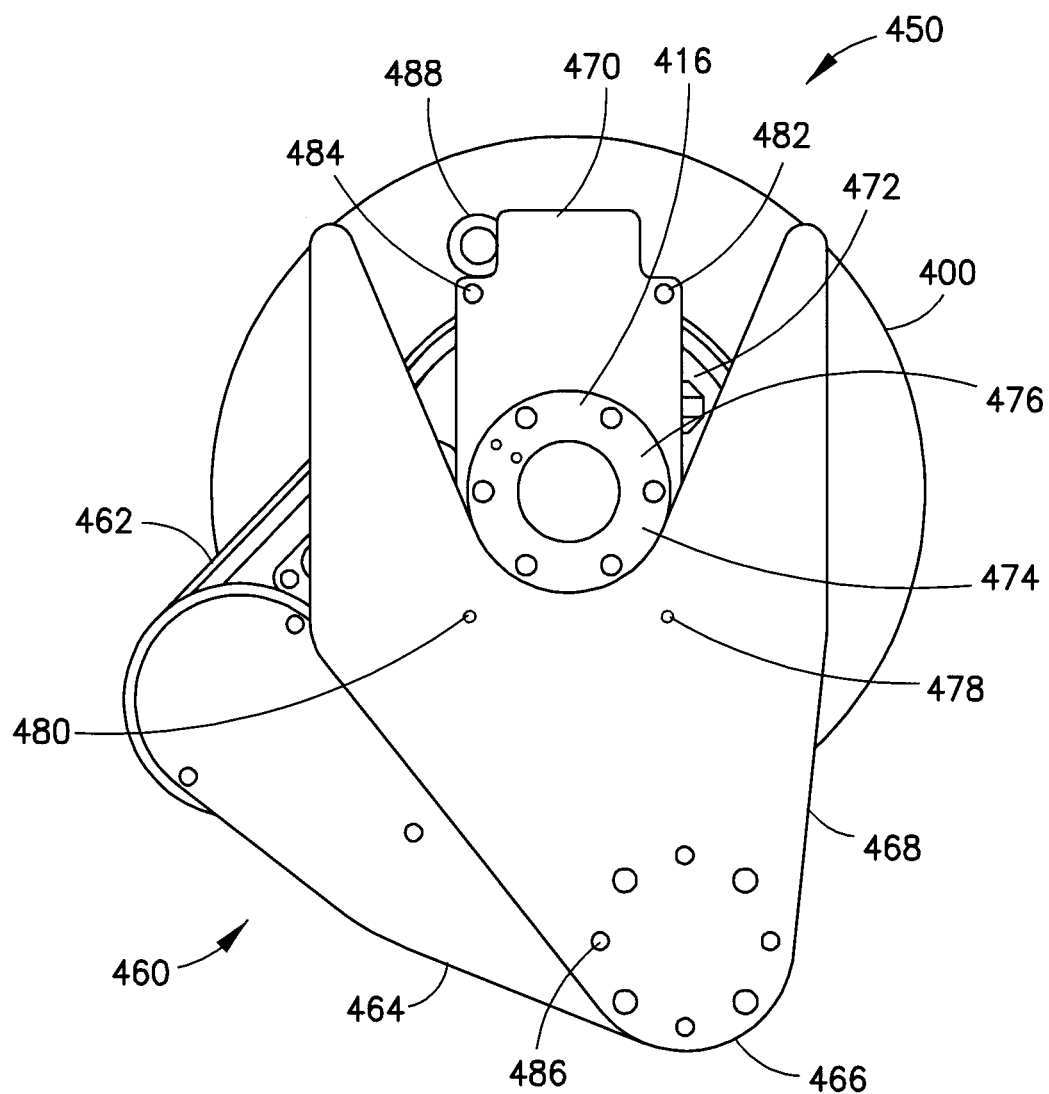
FIG. 6 is a top view of the drive shown in FIG. 4 and a robot arm connected thereto.

Referring now to FIG. 4 and FIG. 5 there is shown partial isometric exploded and section views respectively of drive 400 for use as at least part of robot drive 10. Drive 400 is shown as a two axis drive for exemplary purposes only. In alternate aspects of the disclosed embodiment, the features described may be applied to more or less axes, for example, to three coaxial axes and one or more vertical (z) axis. Drive 400 has coaxial motor encoder housing 410 with fixedly attached mounting flange 412. Drive 400 may further have driven shaft (T1) 414 and driven shaft (T2) 416. Arm mounting flange 418 is provided coupled to driven shaft 414. Fixture pin 420 may interface with hole 422 of flange 418 and slot 424 of housing 410. Multiple hole patterns 426 on shaft 414 may be provided interfacing with slotted pattern 428 of flange 418 such that installation and tightening of screws 430 couples flange 418 to shaft 414. The slotted pattern 428 is a curved elongate slot which allows the flange to rotate relative to the screws 430 before the screws are tightened. Consistent with earlier described method, the T1 shaft 414 may be placed at a predetermined position, flange 418 installed on shaft 414 and fixture pin 420 installed as shown in FIG. 5 locking the location of flange 418 relative to housing 410/412. Upon installation and tightening screws 430, flange 418 is repeatably coupled and oriented relative to drive housing 410/412. Locating feature(s) 432 may be provided such that as drive 400 is installed in a higher level system, the orientation of drive 400 is consistent from unit to unit. Flange 418 further has a hole pattern and locating features 434 such that an upper arm may be repeatably mounted thereto, for example, as shown in FIG. 6. Referring now to FIG. 6, there is shown a top view of robot 450 having drive 400 and arm assembly 460. Removable fixture 470 is further shown as will be described. Arm 460 has upper arm 462, forearm 464, wrist 466 and end effector 468. Arm 460 further has pulley 472 coupled to T2 shaft 416 by clamp ring 474. Here clamp ring 474 may couple shaft 416 to pulley 472 upon tightening of flange 476 (coupled to pulley 472). Assembly and location of arm 460 to drive 400 is as follows. Upper arm 462 is coupled to flange 418 and oriented by locating features as described. Fixture 470 has pins 478, 480 that interface with mating pinhole and slot of end effector 468. Bosses 482, 484 are provided on the opposing side of fixture 470 and mate with the outer diameter of upper arm 462 to establish the radial location and orientation of end effector 468. Bolts 486 may then be tightened coupling end effector 468 to wrist 466. Fixture pin 488 may then be installed in flange 412 of drive 400 and the combination arm and fixture rotated 490 till face 492 of fixture 470 contacts pin 488. With the T2 shaft in the proper orientation, clamp 476 may be tightened coupling pulley 472 to T2 shaft 416. In this manner, arm 460 is coupled to drive 400 such that a similar drive and arm combination may use the same configured controller without reconfiguration.

Figure 5A:
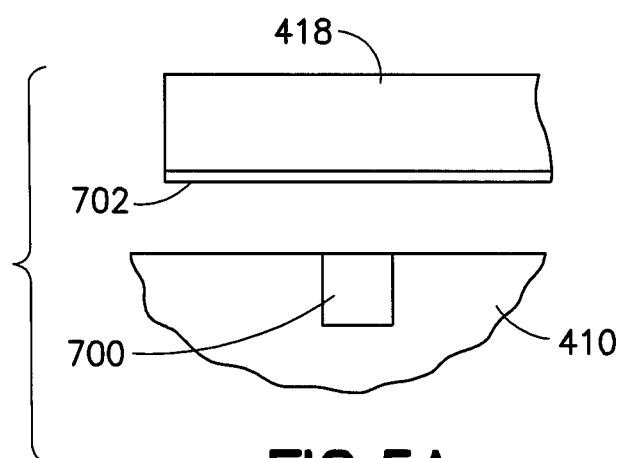
FIG. 5A is a sectional view showing components of an example encoder.

An example of one of the position encoders is shown in FIG. 5A. In this example the position encoder comprises a read head 700 on the encoder housing 410 and a reference disk 702 on the flange 418. The rotational position of the flange 418 can be adjusted on the shaft of the rotor to zero the encoder to match a zero commutation angle of the shaft relative to the stator. Then the fasteners 430 can be tightened to stationarily fix the flange 418 to the top of the shaft 414.

In one aspect of the disclosed embodiment, a phasing and zeroing method and apparatus disclosed below. Here, there are provided adjustable components between the driving elements of the robot drive (ex: T1, T2 shafts) and the driven parts of the arm (ex: upper arm and shoulder pulley) that may be used to achieve the desired phasing to facilitate interchangeability between arms, drives and controllers. Further, the required range of mechanical adjustability may be reduced, for example, from 360 degrees to 12 degrees or otherwise in the implementation disclosed, which may reduce the slot lengths and number of mounting holes, for example, leading to structural properties supporting stiffness and stability. The adjustment range reduction is facilitated by the motor phasing and encoder zero or reference setting being able to be conducted at any of a number of pole locations on the motor stator set where the phasing may be conducted within one or more cycles and where multiple electrical cycles make up a single mechanical cycle or rotation. Further, no additional interface or joint that transmits torque and/or load is introduced, for example, in the T2 axis or otherwise.

Referring now to FIG. 7, there is shown a diagram of encoder-motor phasing method 500. The purpose of method 500 is to phase the encoder and motor so that a predefined commutation angle offset can be used to commutate the motor based on the position reported by the encoder. The procedure produces a set of encoder position offsets that can be applied to re-zero the encoder to achieve the desired result. In step 510, energize windings of the motor by applying constant current between two terminals of the motor. This may energize two windings in a wye-configured motor and a single winding in a delta-configured motor. The rotor will move to a position defined by the energized winding(s). In step 512, read encoder position and determine commutation angle offset based on the winding(s) energized, the direction of the current and the encoder position. In step 514, steps 510 and 512 may be repeated for the remaining combinations of the motor terminals and for currents in opposite directions. This may result in the total of 6 distinct encoder position readings and 6 values of commutation angle offset. In alternate aspects, more or less distinct readings may be provided. In step 516, determine the minimum and maximum of the 6 values of the commutation angle offset. The difference between the maximum and minimum value may be calculated. The difference with a predefined accuracy threshold may be compared. If the difference exceeds the accuracy threshold, the method may stop and produce an error. In step 518, the 6 values of the commutation angle offset may be used to calculate their average and designate the value as the commutation angle offset. In step 520, the commutation angle offset may be utilized to determine an encoder position offset that can be applied to change the commutation angle offset to the predefined commutation angle offset. By way of example, for a brushless permanent magnet DC motor with P pole pairs (2P rotor magnets), there are P distinct solutions within one revolution, spaced by 360 deg/P from each other. In step 522, select one solution (i.e., one encoder position offset) found in the previous step and use it to electronically re-zero or reference the encoder as described in the arm-encoder phasing method described below. In one aspect, the method may be fully automated. Alternatively, in step 510, different current patterns through all three terminals of the motors may be used to move the rotor to a position defined by the current pattern. There may be an infinite number of positions, limited just by the resolution of the current control. Alternatively, in steps 512 and 514, any number of encoder readings associated with different current patterns may be obtained, and any number of values of commutation angle offset may be calculated. Alternatively, in step 516, any suitable method to check the validity of the read and calculated data may be used. Alternatively, in step 518, any suitable technique to determine the commutation angle offset may be used.

Referring now to FIG. 8, there is shown a diagram of arm-encoder phasing method 550. The purpose of this method is to phase the driven parts of the arm with respect to the encoders so that a predefined configuration of the arm is represented by predefined values of encoder readings. At the same time, the procedure allows the use of the predefined commutation angle offset as described in the encoder-motor phasing method above.

Figure 9:
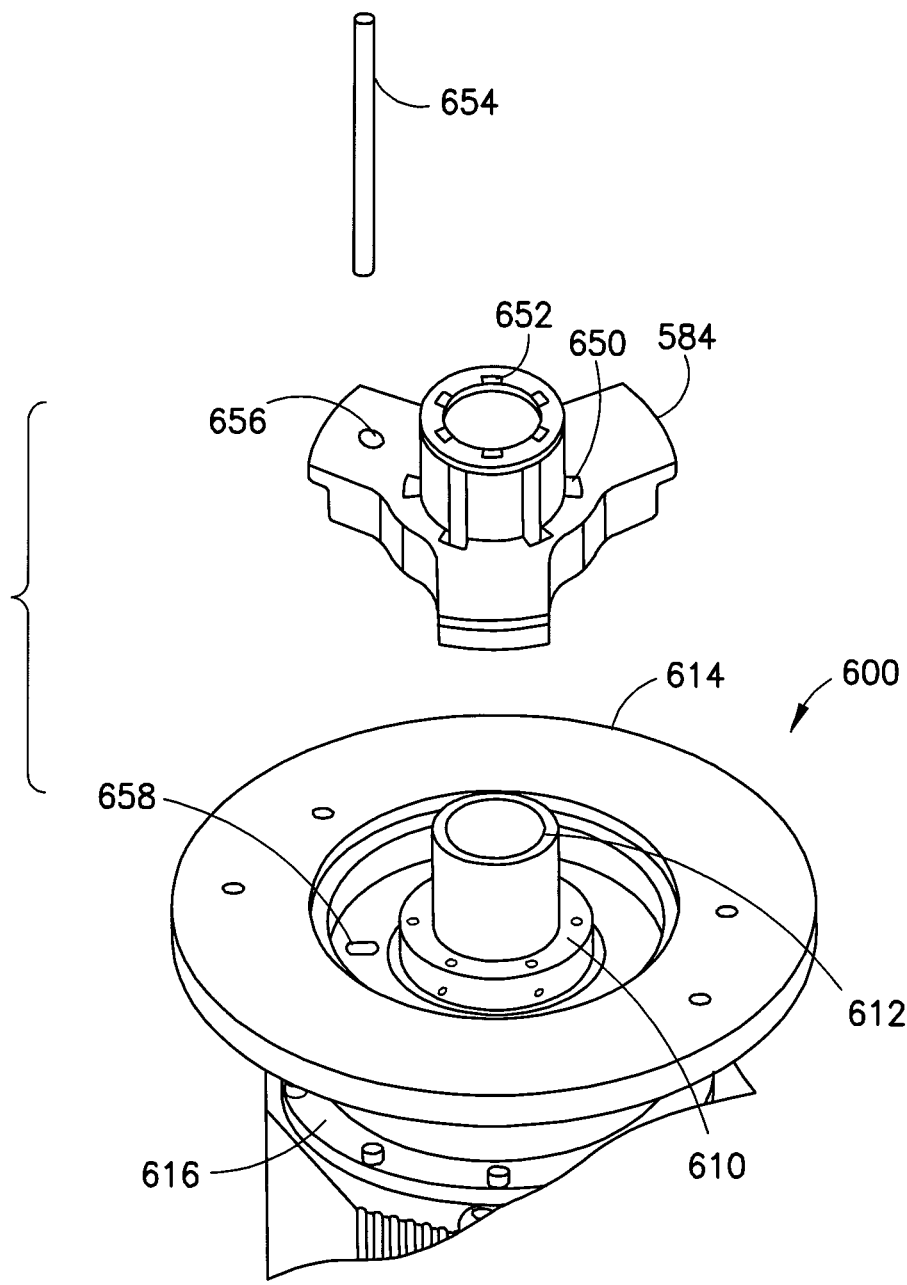
FIG. 9 is a partial exploded perspective view similar to FIG. 4 of some components of another example of the drive.
Figure 10:
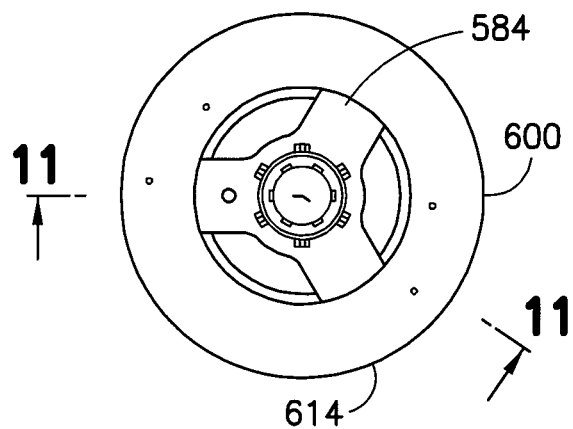
FIG. 10 is a top view of the example shown in FIG. 9.
Figure 11:
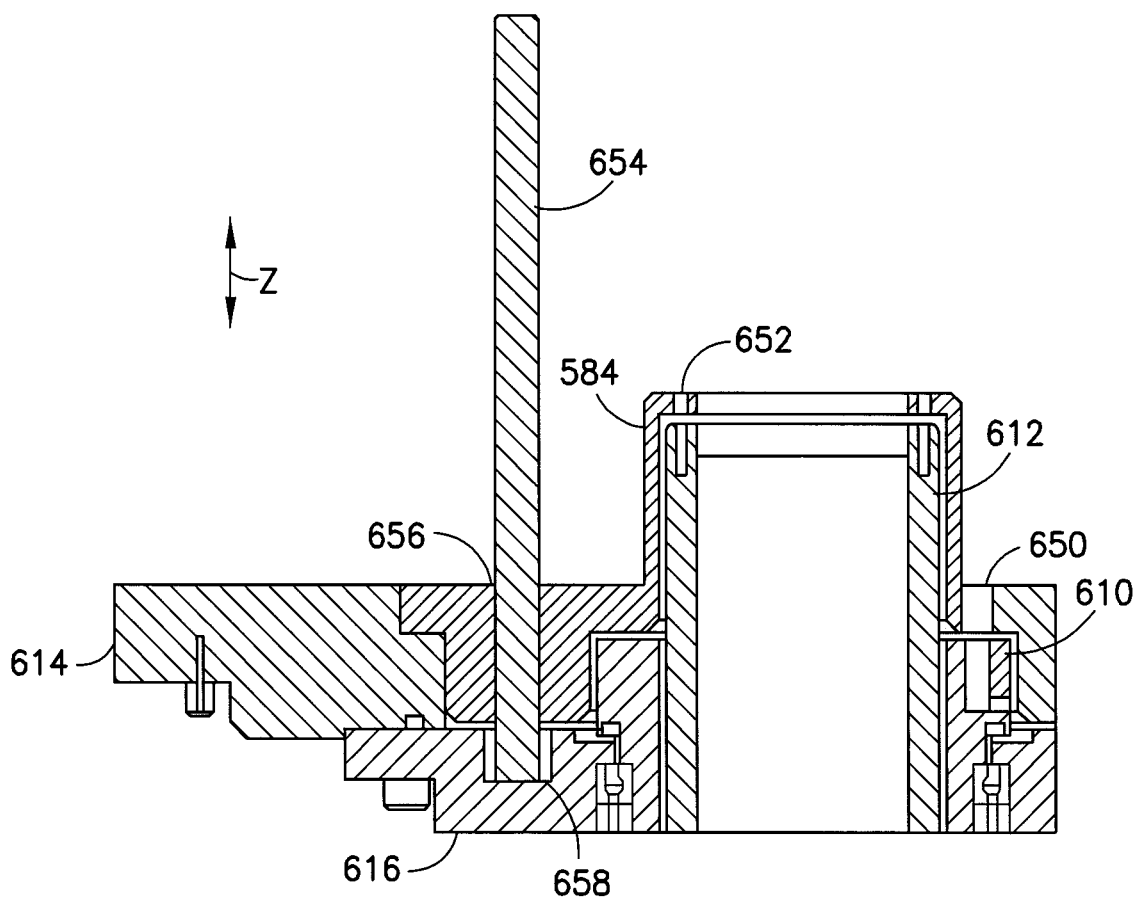
FIG. 11 is a cross sectional view of the example shown in FIG. 9.
Figure 12:
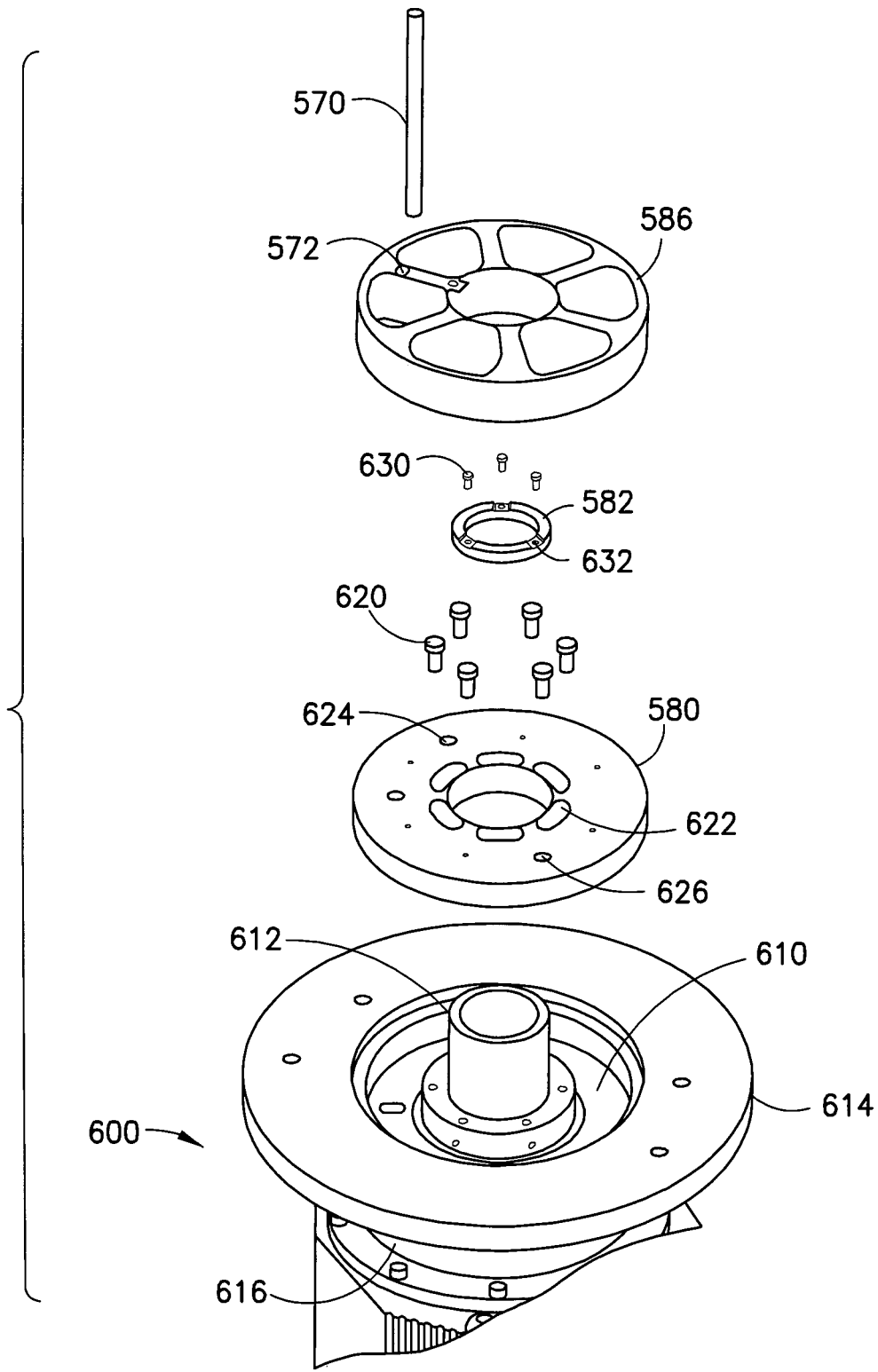
FIG. 12 is a partial exploded perspective view similar to FIG. 4 of some components of another example of the drive.
Figure 13:
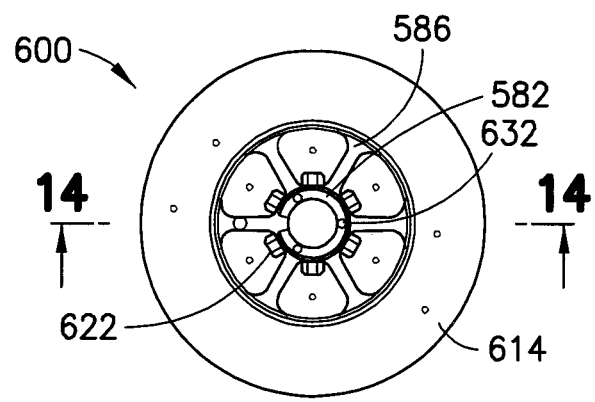
FIG. 13 is a top view of the example shown in FIG. 12.
Figure 14:
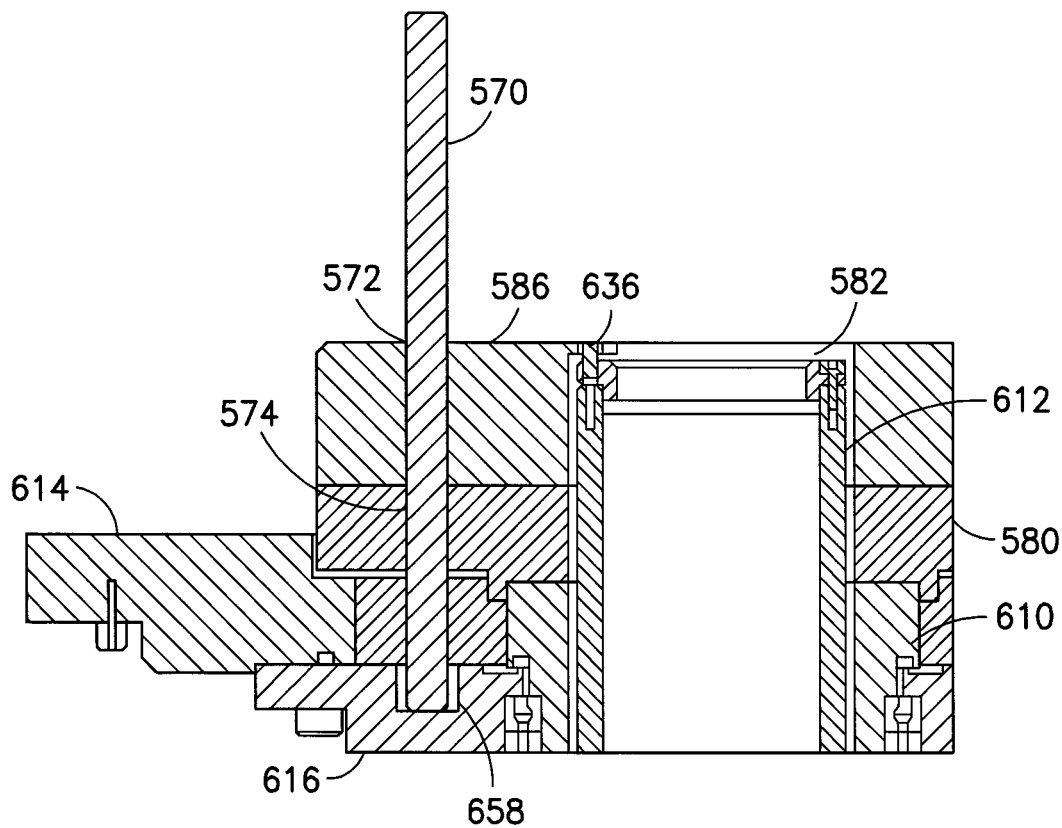
FIG. 14 is a cross sectional view of the example shown in FIG. 12.
Figure 15:
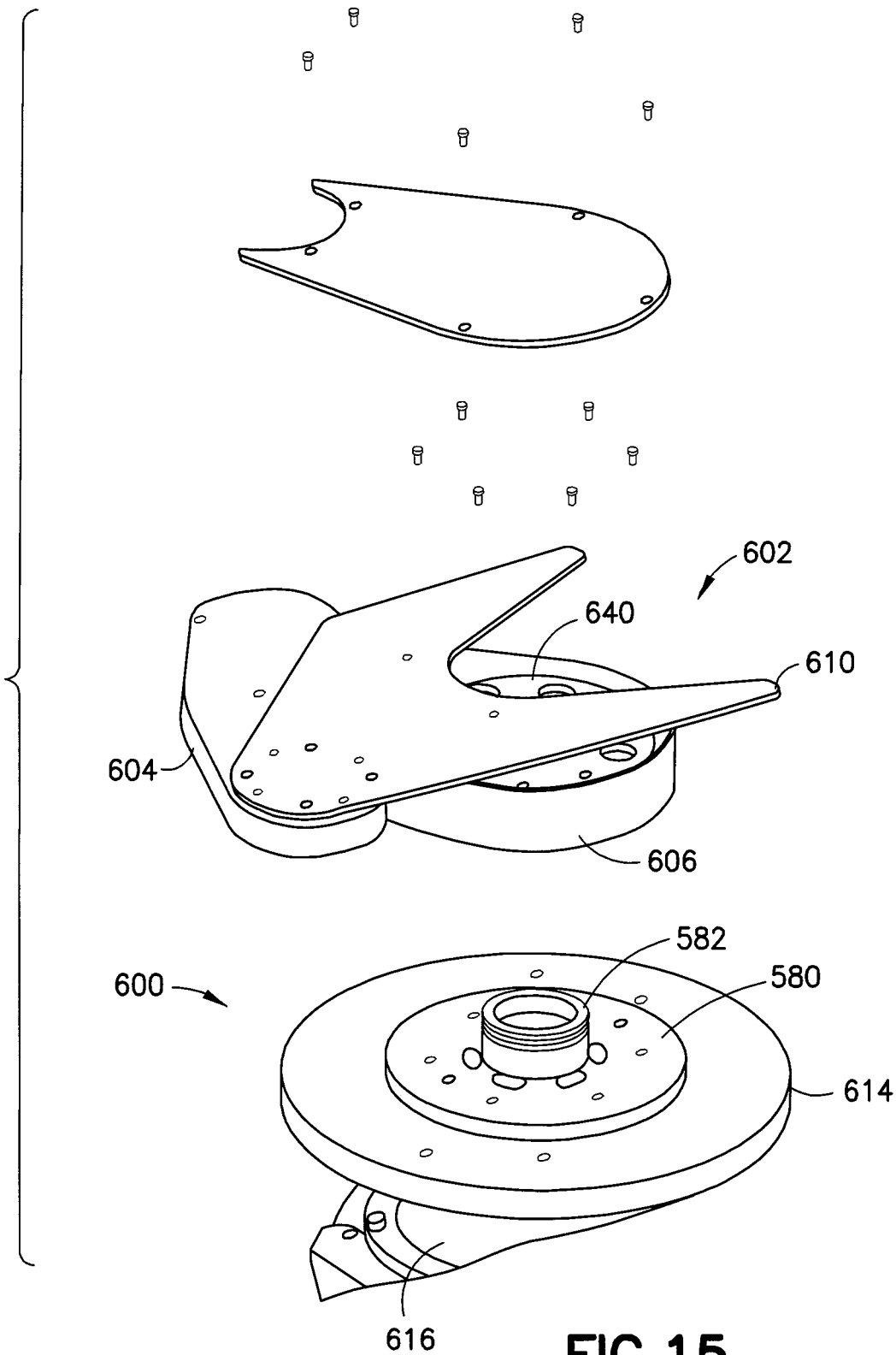
FIG. 15 is a partial exploded perspective view of some components of another example.
Figure 16:
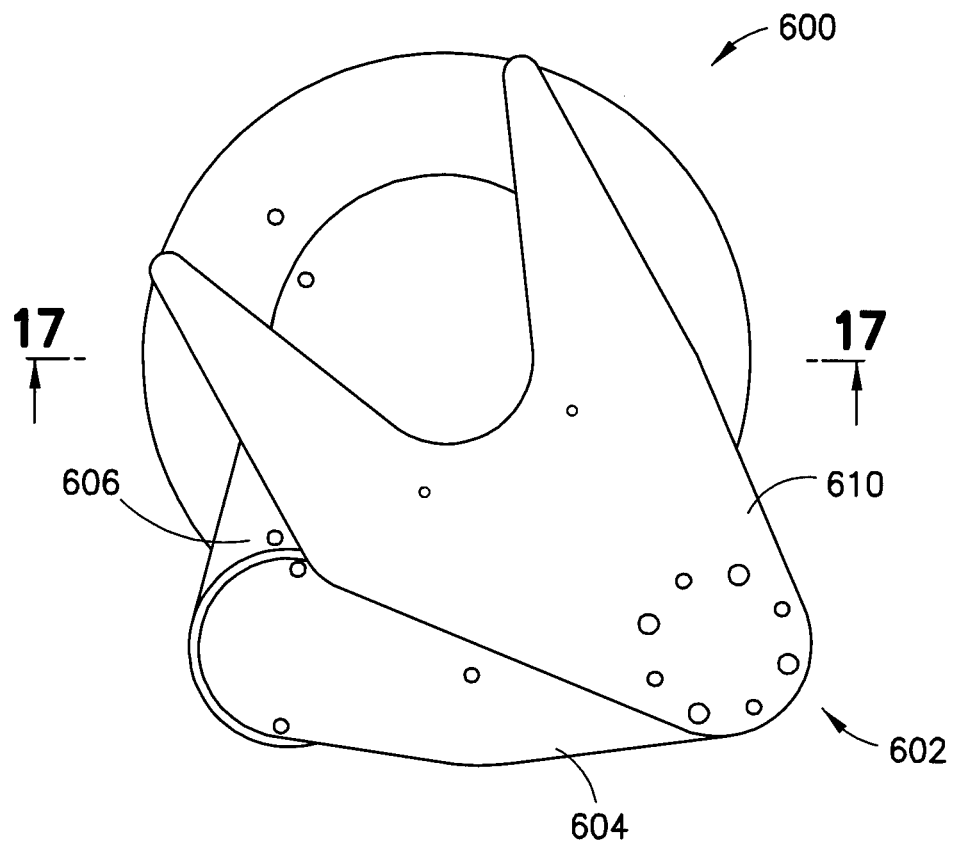
FIG. 16 is a top view of the example shown in FIG. 15.

The method may utilize the following hardware, as shown in FIGS. 9-17. As seen in FIGS. 12, 14 and 15, T1 adapter flange 580 is shown. In the example implementation, T1 adapter 580 is configured to attach to the T1 shaft via 6 mounting screws. The T1 adapter features 6 semi-circular slots for the 6 mounting screws. The slots allow for angular adjustment of the T1 adapter with respect to the T1 shaft within a 12-deg range (the required range depends on the number of mounting holes in the T1 shaft and the number of motor pole pairs). The T1 adapter also features a pair of pins that locate uniquely the upper arm of the linkage with respect to the T1 adapter. As seen in FIGS. 12, 14, 15 and 17, T2 cap 582 is shown. In the example implementation, T2 cap 582 is configured to attach to the T2 shaft via 3 screws using 6 mounting holes in the T2 shafts. The T2 cap features 3 semi-circular slots for the 3 mounting screws. The slots allow for angular adjustment of the T2 cap with respect to the T2 shaft within a 12-deg range (the required range depends on the number of mounting holes in the T2 shaft and the number of motor pole pairs). The T2 cap also features a pin that locates uniquely the keyless bushing and pulley in the linkage with respect to the T2 cap. The T2 cap does not transmit any torque-torque is transmitted strictly via the keyless bushing. As seen in FIGS. 9, 10 and 11, fixture 584 is shown to select correct encoder offset (out of the P available solutions). Fixture 584 features 6 12-deg slots that mimic the slots in the T1 adapter and 3 12-deg slots that mimic the slots in the T2 cap (any number of slots between 1 and 6 can be used). The correct angular position of the fixture may be set using a pin that drops through a precision hole in the fixture to a precision radial slot in the flange of the robot drive. As seen in FIGS. 12, 13 and 14, fixture 586 is shown to accurately define angular position of the T1 adapter and T2 cap with respect to the flange of the robot drive. The fixture registers with respect to the T1 adapter using the pair of pins on the T1 adapter. The fixture registers with respect to the T2 cap using the pin on the T2 cap. The correct angular position of the fixture is set using a pin that drops through a precision hole in the fixture to a precision radial slot in the flange of the robot drive.

Referring now to FIG. 8, there is shown a diagram of arm-encoder phasing method 550. In step 560, install fixture 584 to select correct encoder offset. This includes inserting a pin through a precision hole in the fixture into a precision radial slot in the flange of the robot drive to set the angular orientation of the fixture with respect to the flange of the robot drive. In step 562, move T1 shaft incrementally to positions that correspond to the different solutions found in the encoder-motor phasing method. The solution may be selected for which mounting holes in the T1 shaft show in the slots in the fixture, and electronically re-zero or reference the encoder. In step 564, move T2 shaft incrementally to positions that correspond to the different solutions found in the encoder-motor phasing method above. The solution may be selected for which mounting holes in the T2 shaft show in the slots in the fixture, and electronically re-zero or reference the encoder. Fixture 584 may be removed to select correct encoder offset. In step 566, place the T1 adapter 580 in position on the T1 shaft. In step 568, place T2 cap 582 in position on the T2 shaft. Here, mounting screws may not be installed at this point. In step 570, install the fixture 586 to accurately define angular position. For example, this may include inserting a pin through a precision hole in the fixture into a precision radial slot in the flange of the robot drive to set the angular orientation of the fixture with respect to the flange of the robot drive. In the process, engage the pair of pins in the T1 adapter and the pin in the T2 cap with the fixture. In step 572, install screws that couple the T1 adapter 580 to the T1 shaft and screws that couple the T2 cap 582 to the T2 shaft while keeping the T1 and T2 shafts in position, e.g., using servo control or otherwise. Here, the fixture 586 may be removed. As will be described, the arm may now be mounted in a repeatable and replaceable fashion. In alternate aspects, any number of mounting holes and screws for the T1 adapter and T2 cap may be used. The minimal length of the slots depends on the number of mounting holes in the shafts and the number of motor pole pairs. Alternatively, instead of stepping through the solutions as described in 562 and 564 above, the shafts can be moved to a given position that allows for proper attachment of the arm, the encoder positions of the shafts can be read and the readings can be used to select the correct encoder offset solutions. The shafts can then be repositioned based on the selected solutions, and the T1 adapter and T2 cap can be installed as described in 570 and 572 above. In alternate aspects, the features associated with steps 560-564 may be conducted with fixture 586; requiring a single fixture.

Figure 17:
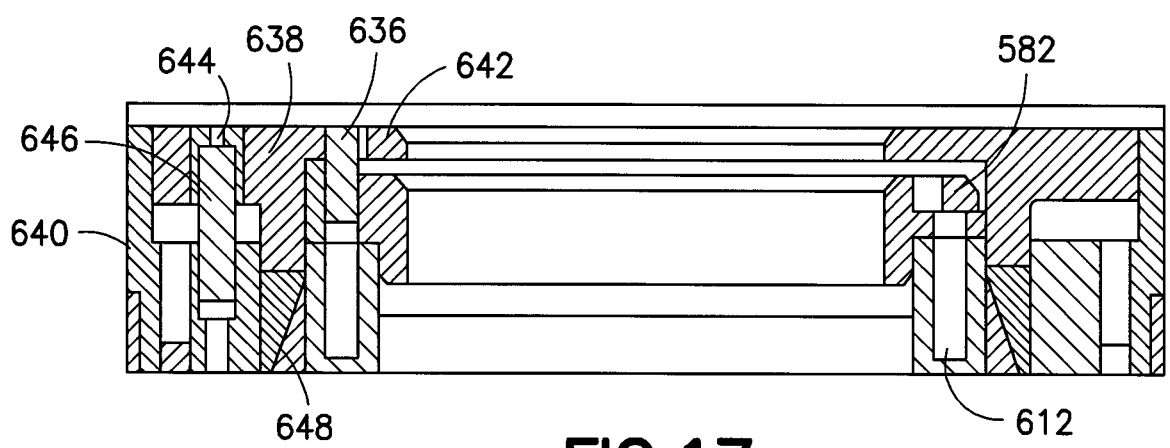
FIG. 17 is a cross sectional view.

Referring to FIG. 9 there is shown a partial isometric view of vacuum robot drive 600 and roughing fixture 584. Referring also to FIG. 10 there is shown a top view of vacuum robot drive 600 and roughing fixture 584. Referring also to FIG. 11 there is shown a partial section view of vacuum robot drive 600 and roughing fixture 584. Drive 600 has T1 shaft 610, T2 shaft 612, flange 614 and housing 616. Here housing 616 is sealed and coupled to flange 614 where T1 shaft 610 and T2 shaft 612 are coaxially rotatable with respect to flange 614 and housing 616. In alternate aspects, T1 shaft 610 and T2 shaft 612 may be axially moveable, for example, in a Z direction with respect to flange 614 and housing 616. In alternate aspects, more or less shafts may be provided. For example, the features of the disclosed embodiment may be applied to positively locate more or less rotary axis with respect to a fixed reference. Referring also to FIGS. 12-15, T1 adapter flange 580 is shown. In the example implementation, T1 adapter 580 is configured to attach to the T1 shaft 610 via 6 mounting screws 620. The T1 adapter features 6 semi-circular slots 622 for the 6 mounting screws 620. The slots 622 allow for angular adjustment of the T1 adapter 580 with respect to the T1 shaft 610 within a 12-deg range (the required range depends on the number of mounting holes in the T1 shaft and the number of motor pole pairs). The T1 adapter 580 also features a pair of pins 624, 626 that locate uniquely the upper arm of the linkage with respect to the T1 adapter. For example, the pins may be of differing diameters to uniquely locate the upper arm. Referring also to FIGS. 12-15 and 17, T2 cap 582 is shown. In the example implementation, T2 cap 582 is configured to attach to the T2 shaft 612 via 3 screws using 6 mounting holes in the T2 shaft 612. The T2 cap 582 features 3 semi-circular slots 632 for the 3 mounting screws 630. The slots 632 allow for angular adjustment of the T2 cap with respect to the T2 shaft 612 within a 12-deg range (the required range depends on the number of mounting holes in the T2 shaft and the number of motor pole pairs). The T2 cap 582 also features a pin 636 that locates uniquely the keyless bushing 638 and pulley 640 in the linkage with respect to the T2 cap 582. The T2 cap 582 does not transmit any torque-torque is transmitted strictly via the keyless bushing 638. As seen in FIG. 15, arm 602 and drive 600 are shown where arm 602 has forearm 604, upper arm 606, pulley 640 and end effector 610. FIG. 17 refers to a partial cross section of drive 600 with arm 602 installed. Cap 582 is fastened to T2 shaft 612 after location by the method previously described. Keyless bushing 638 has slot 642 that mates with pin 636 of cap 582. Keyless bushing 638 further has slot 644 that mates with pin 646 of pulley 640. Tapered clamp collar (ex: ringfeder) 648 is compressed when keyless bushing 638 is bolted to pulley 640 positively coupling pulley 640 to T2 shaft 612. In this manner the T2 cap 582 does not transmit any torque as tapered clamp collar (ex: ringfeder) 648 transmits torque from coupling pulley 640 to T2 shaft 612. Further, the T2 cap 582 is also uniquely located with respect to pulley 640 via the pins and slots and keyless bushing 638. Referring to FIGS. 9-11, fixture 584 is shown to select correct encoder offset (out of the P available solutions). Fixture 584 features 6 12-deg slots 650 that mimic the slots in the T1 adapter and 3 or 6 12-deg slots 652 that mimic the slots in the T2 cap (any number of slots between 1 and 6 can be used). The correct angular position of the fixture is set using a pin 654 that drops through a precision hole 656 in the fixture to a precision radial slot 658 in the flange or housing of the robot drive. Referring to FIGS. 12-14, fixture 586 is shown to accurately define angular position of the T1 adapter and T2 cap with respect to the flange of the robot drive. The fixture 586 registers with respect to the T1 adapter 580 using the pair of pins 624, 626 on the T1 adapter 580. The fixture 586 registers with respect to the T2 cap 582 using the pin 636 on the T2 cap 582. The correct angular position of the fixture 586 is set using a pin 570 that drops through a precision hole 572 in the fixture, through a hole 574 in the flange 580 to a precision radial slot 658 in the flange or housing of the robot drive.

Three phase brushless motors are commutated based on the rotary position of the rotor considered with respect to the stator. For this purpose, the rotor position is read by an encoder. However, there remains the question of where the encoder position is with respect to specific coil phases of the three phase winding in the stator. This information is referred to as the motor phase or, motor offset or sometimes as the motor hall offset. It is noted that the last name can be a misnomer as the commutation process relevant here may not have hall sensors or any other hall-effect devices.

Conventionally the motor phase may be determined by an auto-phasing procedure built into a three phase brushless motor amplifiers. The auto-phase procedure determines the motor phase. For example, the motor phase may be equal to the difference in angle, expressed in electrical degrees, between the motor's electric angle zero and the encoder position zero. Here, the motor phase thus determined is a function of where the encoder target is installed with respect to the rotor shaft, and in general varies from assembly to assembly.

In the disclosed, all or common assemblies may have the same motor phase, typically zero or some suitable reference. This can be achieved by offsetting the encoder position zero to match up with the motor electric angle zero. This makes the difference between the two zero, and thus the motor phase is zero. For example, this may be referred to as zero phasing.

The encoder position zero can be offset in one or more methods, based on the ability/technology of the encoder. One method writes an offset that is stored on the encoder. The encoder thereafter reports a position that is always shifted by said offset. In another method the encoder offset cannot be directly written to. In this case the encoder and motor rotor need to be rotated together, to a position where the motor electrical angle is zero, at which point the encoder is instructed to regard this new position as its new position of reference, or its new zero or other suitable reference. The encoder may achieve this by calculating an offset and thereafter reporting a position that is always shifted by this offset.

An algorithm for Zero Phasing when the encoder supports Position Offset is disclosed as follows.

The algorithm for zero phasing motors with encoders that support position offset may be as follows:
1) Change motor phase on amplifier to zero. Starting with a nonzero phase may cause the underlying mathematics to be invalidated.
2) Change encoder offset on encoder to zero. Starting with a nonzero offset may cause the underlying mathematics to be invalidated.
3) Apply phasing current to motor and change the commanded electrical position to $m_i$=[30, 90, 150, 210, 270] allowing the motor to come to rest before changing the commanded electrical position. Read the encoder position for each of the commanded position.
4) Un-wrap the encoder positions if required and convert to mechanical degrees $\theta_i$.
5) Determine the angular offset $\emptyset_i$, for each set of data recorded above, in mechanical degrees, between the encoder and motor electrical angle:

$$\emptyset_i = \theta_i - \frac{m_i}{n_{pp}} - \frac{(N-1)*360}{n_{pp}}$$

6) Here, $n_{pp}$ is number of pole pairs on the rotor, and N is the smallest integral multiple of 360 electrical degrees, expressed in mechanical degrees, that can fit within $\theta_i$
7) The angular offsets $\emptyset_i$ calculated above are a measure of the nearest mechanical position offset that corresponds to an electrical position of 0. Or stated differently, if the shaft is rotated by a negative of this amount it would reach a position corresponding to a zero electrical angle. The average mechanical angular offset is then calculated as the average of $\emptyset_i$.
8) The average mechanical angular offset can be converted to electrical degrees, and wrapped so that it lies in the range 0 to $2\pi$, the resulting number is the motor phase as expressed in electrical measure. This number is numerically the same as the result of the auto-phasing procedure, if one were to be performed.

9) If the average mechanical angular offset is converted to encoder counts and written to the registers on the encoder, taking care of the sign, the effect would be the same as shifting the encoder with respect to the rotor, such that the encoder and motor electrical angle zeros now coincide.
10) At this moment the motor is zero phased, or to put it another way, any subsequent attempts to auto-phase the motor would evaluate a motor phase of zero or the assigned reference location.
11) In extension it is possible to set up a set of numbers, referred to as the encoder offset solutions, such that any one of them would achieve the effect of zero phasing as described above. However this would allow the physical zero position of the encoder to be moved. These solutions are simply 360 electrical degree offsets to the average mechanical angular offset, taking care of all the necessary conversions and signs. The advantage of this extension is that the shaft tied to the encoder may now report zero at a set of different locations with respect to the robot.

An algorithm for Zero Phasing when the encoder does not support Position Offset is disclosed as follows.

The algorithm for zero phasing motors with encoders that do not support position offset follows the procedure above till step 7. At which point the encoder/rotor pair is physically rotated to the new position such that the electrical angle is zero. The encoder is then zeroed or set at a given reference location and the encoder and motor electrical angle zeros now coincide.

Alternatively, the motor could have been commanded to the zero electrical angle position and the encoder could have been zeroed.

An example apparatus comprises a stator configured to be stationarily connected to a housing; and a rotor configured to have a robot arm connected thereto, where the rotor comprises a shaft and an robot arm mount adjustably connected to the shaft; where the stator and the rotor comprise mechanical reference locators to temporarily stationarily locate the robot arm mount to the stator for subsequently stationarily fixing the robot arm mount to the shaft.

The mechanical reference locators may comprise holes configured to receive a fixture pin to align the robot arm mount to the stator. The fixture pin may be configured to temporarily slide into the holes to align axial rotation position of the robot arm mount relative to the stator. The apparatus may further comprise fasteners which stationarily fix the robot arm mount to the shaft, where the robot arm mount comprises curved fastener slots configured to receive the fasteners and allow the robot arm mount to be adjusted to an angular rotated position on the shaft before the fasteners stationarily fix the robot arm mount to the shaft. The housing may be a substrate transport housing, and where the stator is on an encoder housing which comprises a locating feature to align the encoder housing with the substrate transport housing at a predetermined rotational angle in a receiving area of the housing. The apparatus may further comprise an encoder configured to sense a rotational angle of the rotor relative to the stator, where the apparatus is configured to determine a commutation angle offset. The apparatus may be configured to re-zero the encoder based upon the commutation angle offset. The apparatus may further comprise a robot arm connected to the rotor and an encoder configured to sense location of the rotor relative to the stator, where the apparatus is configured to phase a driven part of the robot arm with respect to the encoder. A substrate transport apparatus may be provided comprising a substrate transport apparatus housing; a robot drive as described above and at least one encoder; a robot arm connected to the robot drive, where the robot arm is configured to support at least one substrate thereon; and a controller comprising at least one processor and at least one memory, where the controller it connected to the robot drive to control movement of the robot drive and the robot arm.

An example method comprises locating a shaft of a rotor relative to a stator of a motor; locating a robot arm mount on the shaft; temporarily stationarily fixing the robot arm mount relative to the stator at a predetermined rotational location relative to the stator; and while the robot arm mount is temporarily stationarily fixed relative to the stator at the predetermined rotational location, stationarily fixing the robot arm mount to the shaft by a connection, where the connection allows the robot arm mount to be stationarily fixed to the shaft at a plurality of angular orientations.

Locating the shaft of the rotor relative to the stator may comprise energizing the motor to move the rotor to a predetermined commutation angle. Temporarily stationarily fixing the robot arm mount relative to the stator may comprise inserting a removable fixture pin into aligned holes in the robot arm mount and the stator. The connection may comprise fasteners which stationarily fix the robot arm mount to the shaft, where the robot arm mount comprises curved fastener slots configured to receive the fasteners and allow the robot arm mount to be adjusted to an angular rotated position on the shaft before the fasteners stationarily fix the robot arm mount to the shaft. An encoder may be provided to determined angular rotational position of the rotor relative to the stator, and the method further comprising determining a commutation angle offset for the motor and re-zero the encoder based upon the commutation angle offset. A robot arm may be connected to the rotor and an encoder is provided which is configured to sense location of the rotor relative to the stator, where the method further comprises phasing a driven part of the robot arm with respect to the encoder.

An example apparatus may comprise a housing; and a substrate transport apparatus connected to the housing, where the substrate transport apparatus comprises a robot arm and a robot drive configured to move the robot arm, where the robot drive comprises: a motor comprising a stator and a rotor; and means for providing predetermined encoder position and motor commutation position with respect to the robot arm relative to the housing for preconfigured controllers to be alternatively used to control the motor, for moving the robot arm, without reconfiguring the controller for use with the robot drive. The means may comprise the mechanical and electrical configurations as described above for example.

An example apparatus may comprise a stator configured to be stationarily connected to a substrate transport housing; and a rotor configured to have a robot arm connected thereto, where the rotor comprises a shaft and a robot arm mount adjustably connected to the shaft, where the stator and rotor are configured to adjustably locate the robot arm mount to the shaft to provide a predetermined location of the robot arm mount relative to the stator to compensate for the stator being located at one of a plurality of different locations on the substrate transport housing.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. A method comprising:
    locating a shaft of a rotor relative to a stator of a motor;
    locating a robot arm mount on the shaft;
    temporarily stationarily fixing the robot arm mount relative to the stator at a predetermined rotational location relative to the stator; and
    while the robot arm mount is temporarily stationarily fixed relative to the stator at the predetermined rotational location, stationarily fixing the robot arm mount to the shaft by a connection, where the connection allows the robot arm mount to be stationarily fixed to the shaft at one of a plurality of angular orientations.

2. A method as in claim 1 where locating the shaft of the rotor relative to the stator comprises energizing the motor to move the rotor to a predetermined commutation angle.

3. A method as in claim 1 where temporarily stationarily fixing the robot arm mount relative to the stator comprises inserting a removable fixture pin into aligned holes in the robot arm mount and the stator.

4. A method as in claim 1 where the connection comprises fasteners which stationarily fix the robot arm mount to the shaft, where the robot arm mount comprises curved fastener slots configured to receive the fasteners and allow the robot arm mount to be adjusted to an angular rotated position on the shaft before the fasteners stationarily fix the robot arm mount to the shaft.

5. A method as in claim 1 where an encoder is provided to determined angular rotational position of the rotor relative to the stator, and the method further comprising determining a commutation angle offset for the motor and re-zero the encoder based upon the commutation angle offset.

6. A method as in claim 1 where a robot arm is connected to the rotor and an encoder is provided which is configured to sense location of the rotor relative to the stator, where the method further comprises phasing a driven part of the robot arm with respect to the encoder.

7. A method as in claim 1 further comprising:
    energizing a first winding of the stator of motor with a constant current;
    reading an encoder position for the motor while the first winding is energized;
    determining a first commutation angle offset based upon the read encoder position while the first winding is energized; and
    using the determined first commutation angle offset to electronically re-zero the encoder or assign a location of the encoder to provide a predefined commutation angle offset.

8. A method as in claim 7 further comprising:
    energizing a second winding of the stator the motor with a constant current;
    reading the encoder position for the motor while the second winding is energized;
    determining a second commutation angle offset based upon the read encoder position while the second winding is energized; and
    using the determined second commutation angle offset to electronically re-zero the encoder or assign a location of the encoder to provide the predefined commutation angle offset.

9. A method comprising:
    energizing a first winding of a motor with a constant current;
    reading an encoder position for the motor while the first winding is energized;
    determining a first commutation angle offset based upon the read encoder position while the first winding is energized; and
    using the determined first commutation angle offset to electronically re-zero the encoder or assign a location of the encoder to provide another different commutation angle offset;
    energizing a second winding of the motor with a constant current;
    reading the encoder position for the motor while the second winding is energized;
    determining a second commutation angle offset based upon the read encoder position while the second winding is energized; and
    using the determined second commutation angle offset to electronically re-zero the encoder or assign a location of the encoder to provide the another different commutation angle offset;
    determining a minimum value and a maximum value of the determined commutation angle offsets;
    determining a difference between the minimum value and the maximum value;
    comparing the difference to an accuracy threshold value; and
    performing a predetermined operation based upon the difference exceeding the accuracy threshold value.

10. A method comprising:
    energizing a first winding of a motor with a constant current;
    reading an encoder position for the motor while the first winding is energized;
    determining a first commutation angle offset based upon the read encoder position while the first winding is energized;
    using the determined first commutation angle offset to determine another different commutation angle offset to electronically re-zero the encoder or assign a location of the encoder;
    move a first driving element of the motor to a location based upon a predefined reading from the encoder;
    adjust a robot arm to a predefined configuration;
    couple a driven part of the robot arm to the first driving element of the motor; and
    removing a fixture after the robot arm mount is stationarily fixed to the shaft by the connection.

11. A method comprising:
    energizing a first winding of a motor with a constant current;
    reading an encoder position for the motor while the first winding is energized with the constant current;
    determining a first commutation angle offset based upon the read encoder position while the first winding is energized with the constant current; and
    using the determined first commutation angle offset with a second commutation angle offset to determine a third commutation angle offset, where the third commutation angle offset is used to electronically re-zero the encoder or assign a location of the encoder.

12. A method as in claim 11 further comprising:
    energizing a second winding of the motor with a constant current;
    reading the encoder position for the motor while the second winding is energized;

determining the second commutation angle offset based upon the read encoder position while the second winding is energized.

13. A method as in claim 12 where using the determined first and second commutation angle offsets to determine the third commutation angle offset comprises determining an average commutation angle offset, where the average commutation angle offset comprises the determined first and second commutation angle offsets, and using the average commutation angle offset as the third commutation angle offset to electronically re-zero the encoder or assign a location of the encoder.

14. A method as in claim 11 where the energizing of the first winding of the motor with the constant current is with a first current pattern, and the method further comprises:
energizing the first winding of the motor with at least one different current pattern;
reading the encoder position(s) for the motor while the first winding is energized with the at least one different current pattern;
determining the first commutation angle offset based upon the read encoder positions.

15. A method as in claim 11 further comprising mechanically rotating a rotating portion of the encoder relative to a rotor of the motor to change the third commutation angle offset.

16. A method as in claim 11 further comprising mechanically rotating a stationary portion of the encoder relative to a stator of the motor to change the third commutation angle offset.

17. A method as in claim 16 further comprising:
temporarily stationarily fixing a robot arm mount relative to a stator of the motor at a predetermined rotational location relative to the stator by a fixture; and
while the robot arm mount is temporarily stationarily fixed relative to the stator at the predetermined rotational location, stationarily fixing the robot arm mount to the shaft by a connection, where the connection allows the robot arm mount to be stationarily fixed to the shaft at one of a plurality of angular orientations.

18. A method as in claim 11 further comprising:
locating a shaft of a rotor relative to a stator of the motor;
locating a robot arm mount on the shaft;
temporarily stationarily fixing the robot arm mount relative to the stator at a predetermined rotational location relative to the stator; and
while the robot arm mount is temporarily stationarily fixed relative to the stator at the predetermined rotational location, stationarily fixing the robot arm mount to the shaft by a connection, where the connection allows the robot arm mount to be stationarily fixed to the shaft at a plurality of angular orientations,
where registration features are used to mechanically align rotary parts of the encoder and the motor, and/or stationary parts of the encoder and the motor to achieve phasing associated with the third commutation angle offset.

19. A method as in claim 18 where the first driving element is a shaft of the motor and the method comprises incrementally moving the shaft to positions that correspond to the different solutions found in encoder-motor phasing where mounting holes in the shaft show in slots in the fixture, and then electronically re-zero or reference the encoder.

20. A method as in claim 11 further comprising:
move a first driving element of the motor to a location based upon a predefined reading from the encoder;
adjust a robot arm to a predefined configuration; and
couple a driven part of the robot arm to the first driving element of the motor.

21. The method of claim 11 where the using of the determined first commutation angle offset with the second commutation angle offset to determine the third commutation angle offset comprises determining an average of the determined first commutation angle offset with the second commutation angle offset.

22. The method as in claim 21 where determining the average comprises averaging the first commutation angle offset and the second commutation angle offset with at least one other commutation angle offset.

23. The method of claim 11 further comprising determining a direction of the constant current from different directions and using the determined direction of the constant current to determine the first commutation angle offset.

24. The method as claimed in claim 23 further comprising subsequently applying a constant current to other terminals of the motor to move the motor and allow determining of the second commutation angle offset.

25. The method of claim 11 where the constant current is applied to two terminals of the motor, to energize windings of the motor with a wye-configured network and a delta-configured network, where the first commutation angle offset is determined while the wye-configured network and a delta-configured network are energized.

* * * * *